US009765425B2

(12) United States Patent
Okabe

(10) Patent No.: US 9,765,425 B2
(45) Date of Patent: *Sep. 19, 2017

(54) COPPER ALLOY SPUTTERING TARGET, PROCESS FOR PRODUCING THE SAME AND SEMICONDUCTOR ELEMENT WIRING

(75) Inventor: Takeo Okabe, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 744 days.

This patent is subject to a terminal disclaimer.

(21) Appl. No.: 12/778,283

(22) Filed: May 12, 2010

(65) Prior Publication Data

US 2010/0219070 A1 Sep. 2, 2010

Related U.S. Application Data

(63) Continuation of application No. 10/549,440, filed as application No. PCT/JP2004/001914 on Feb. 19, 2004, now Pat. No. 7,740,721.

(30) Foreign Application Priority Data

Mar. 17, 2003 (JP) ................ 2003-071721

(51) Int. Cl.
*C22C 9/00* (2006.01)
*C22C 9/01* (2006.01)
*C23C 14/34* (2006.01)
*H01L 21/285* (2006.01)

(52) U.S. Cl.
CPC ............ *C23C 14/3414* (2013.01); *C22C 9/00* (2013.01); *C22C 9/01* (2013.01); *H01L 21/2855* (2013.01)

(58) Field of Classification Search
CPC .. C22C 9/00; C22C 9/01; C23C 14/34; C23C 14/3414; H01L 21/2855
USPC .......................... 148/426; 420/470, 471, 489
See application file for complete search history.

(56) References Cited

U.S. PATENT DOCUMENTS

| | | | |
|---|---|---|---|
| 4,822,560 A | 4/1989 | Oyama et al. | |
| 5,023,698 A | 6/1991 | Kobayashi et al. | |
| 5,077,005 A | 12/1991 | Kato | |
| 5,580,669 A | 12/1996 | Beers et al. | |
| 6,066,892 A | 5/2000 | Ding et al. | |
| 6,113,761 A | 9/2000 | Kardokus et al. | |
| 6,143,427 A | 11/2000 | Andler | |
| 6,391,163 B1 | 5/2002 | Pavate et al. | |
| 6,451,135 B1 | 9/2002 | Takahashi et al. | |
| 6,645,427 B1 | 11/2003 | Kardokus et al. | |
| 7,507,304 B2 | 3/2009 | Okabe et al. | |
| 2001/0035237 A1 | 11/2001 | Nagano et al. | |
| 2002/0024142 A1 | 2/2002 | Sekiguchi | |
| 2004/0004288 A1 | 1/2004 | Sekiguchi | |
| 2004/0072009 A1* | 4/2004 | Segal | B21C 23/001 428/561 |
| 2005/0121320 A1 | 6/2005 | Okabe et al. | |
| 2007/0051624 A1 | 3/2007 | Okabe et al. | |
| 2007/0209547 A1 | 9/2007 | Irumata et al. | |
| 2009/0139863 A1 | 6/2009 | Okabe et al. | |
| 2009/0140430 A1 | 6/2009 | Okabe et al. | |
| 2010/0013096 A1 | 1/2010 | Irumata et al. | |

FOREIGN PATENT DOCUMENTS

| | | |
|---|---|---|
| EP | 0601509 A1 | 6/1994 |
| JP | 49-023127 A | 3/1974 |
| JP | 61-231131 A | 10/1986 |
| JP | 63-065039 A | 3/1988 |
| JP | 01042592 A * | 2/1989 |
| JP | S64-42592 A | 2/1989 |
| JP | 05-311424 A | 11/1993 |
| JP | 06-207232 A | 7/1994 |
| JP | 10-060633 A | 3/1998 |
| JP | 10-330927 A | 12/1998 |
| JP | 11-158614 A | 6/1999 |
| JP | 2000-087158 A | 3/2000 |
| JP | 2000-239836 A | 9/2000 |
| JP | 2001-284358 A | 10/2001 |
| JP | 2002-004048 A | 1/2002 |
| JP | 2002-294437 A * | 9/2002 |
| JP | 2002-294438 A | 10/2002 |
| WO | WO03008656 A2 * | 1/2003 |

OTHER PUBLICATIONS

English language Abstract of JP 11-186273 A, Jul. 9, 1999.
English language Abstract of JP 06-140398 A, May 20, 1994.
English language Abstract of JP 02-119140 A, May 7, 1990.
English language Abstract of JP 02-050432 A, Feb. 20, 1990.
English language Abstract of JP 2862727 A, Mar. 3, 1999.
English language Abstract of JP 2001-284358 A, Oct. 12, 2001.
English language Abstract of JP 2002-294437 A, Oct. 9, 2002.
English language Abstract of JP 11-158614 A, Jun. 15, 1999.
English language Abstract of JP 01-096374 A, Apr. 14, 1989.
English language Abstract of JP 01-180976 A, Jul. 18, 1989.
C.K. Hu et al., "Electromigration and Diffusion in Pure Cu and Cu(Sn) Alloys", Mat. Res. Soc. Symp. Proc., vol. 427, pp. 95-106, 1996 (month unknown).

* cited by examiner

*Primary Examiner* — Keith Walker
*Assistant Examiner* — John Hevey
(74) *Attorney, Agent, or Firm* — Howson & Howson LLP

(57) ABSTRACT

A copper alloy sputtering target is provided and contains 0.01 to (less than) 0.5 wt % of at least one element selected from Al or Sn, and containing Mn or Si in a total amount of 0.25 wtppm or less. The above copper alloy sputtering target allows the formation of a wiring material for a semiconductor element, in particular, a seed layer being stable, uniform and free from the occurrence of coagulation during electrolytic copper plating and exhibits excellent sputtering film formation characteristics. A semiconductor element wiring formed with this target is also provided.

20 Claims, No Drawings

COPPER ALLOY SPUTTERING TARGET, PROCESS FOR PRODUCING THE SAME AND SEMICONDUCTOR ELEMENT WIRING

CROSS REFERENCE TO RELATED APPLICATIONS

This application is a continuation of U.S. application Ser. No. 10/549,440, which is the National Stage of International Application No. PCT/JP2004/001914, filed Feb. 19, 2004, which claims the benefit under 35 USC §119 of Japanese Application No. 2003-071721, filed Mar. 17, 2003.

BACKGROUND OF THE INVENTION

The present invention pertains to a copper alloy sputtering target which allows the formation of a seed layer being stable, uniform and free from the occurrence of coagulation during copper electroplating and which exhibits excellent sputtering film formation characteristics, the manufacturing method thereof, and a semiconductor element wiring formed with such a target.

Conventionally, Al (specific resistance of roughly 3.1 $\mu\Omega\cdot$cm) has been used as the wiring material of a semiconductor element, but copper wiring with lower resistance (specific resistance of roughly 1.7 $\mu\Omega\cdot$cm) has been put into practical application pursuant to the miniaturization of wiring.

With the current formation process of copper wiring, often times, after forming a diffusion barrier layer of Ta/TaN or the like in a contact hole or the concave portion of a wiring groove, copper is electroplated thereto. In order to perform this electroplating, as the foundation layer (seed layer), generally, copper or copper alloy is sputtered and deposited thereto.

Ordinarily, electrolytic copper having a purity of 4N (excluding gas components) is employed as the crude metal in a wet or dry high purification process to manufacture high purity copper having a purity of 5N to 6N, and this was used as the sputtering target. Here, there was no particular problem for copper wirings having a semiconductor wiring width of up to 0.18 μm.

Nevertheless, with ultra fine wiring where the copper wiring width is 0.13 μm or less; for instance, 90 nm or 65 nm, and the aspect ratio exceeds 8, the thickness of the seed layer would become an ultra thin film of 100 nm or less, and, when forming a seed layer with a 6N purity copper target, there was a problem in that coagulation would occur and a favorable seed layer could not be formed. Thus, proposals of containing 0.5 to 4.0 wt % of Al or Sn have been made to overcome the problem.

As described above, the uniformity of the foundation layer is important, and, when the foundation layer becomes coagulated, it is not possible to form a uniform film upon forming a copper film via electroplating. For example, defects such as voids, hillocks, and disconnections are formed upon wiring.

Even if defects such as voids described above are not formed, since an uneven electrodeposited texture of copper will be formed in this portion, there is a problem in that the electromigration resistance will deteriorate.

In order to overcome this problem, it is important to form a stable and uniform seed layer upon performing copper electroplating, and a sputtering target optimal in forming a seed layer having superior sputter deposition characteristics is required. Thus, the foregoing inclusion of 0.5 to 4.0 wt % of Al or Sn for preventing coagulation was extremely effective for this purpose.

Nevertheless, it has been discovered that there is a drawback of the sheet resistance of the sputtered film becoming too large. There is a problem in that the sheet resistance will become too large depending on the use, and it is not necessarily effective when focusing on the purpose; that is, the conductivity.

In light of the above, attempts have been made for reducing the sheet resistance by forming a sputtered film, and subjecting this to heat treatment so as to form a deposit. Nevertheless, Al and the like have a high solid solubility limit, it was substantially difficult to form a deposit and reduce the sheet resistance. Further, subjecting the film to heat treatment raised additional problems of complicating the process and affecting the device with heat.

Moreover, although proposals have been made for reducing the resistance of the copper wiring by dispersing Al on the wiring film surface via heat treatment and improving the oxidation resistance (for example, c.f. Japanese Patent Laid-Open Publication No. H6-177117), when this kind of processing is performed on the seed layer, an Al oxide film is formed on the seed layer, and this is inappropriate since the conductivity of the electroplating base layer will decrease.

Heretofore, as the copper wiring material, a method has been proposed of adding certain elements to copper in order to improve the electromigration (EM) resistance, corrosion resistance, bond strength and so on (for example, c.f. Japanese Patent Laid-Open Publication No. H5-311424 and Japanese Patent Laid-Open Publication No. H1-248538). Further, also proposed is a pure copper target or a target in which 0.04 to 0.15 wt % of Ti is added thereto (for example, c.f. Japanese Patent Laid-Open Publication No. H10-60633).

And, in the foregoing proposals, rapid cooling for the uniform dispersion of the added elements, or continuous casting for preventing the segregation of added elements in ingots, shrinkage cavity during casting, and coarsening of crystal grain in ingots are being proposed.

Nevertheless, although there is an advantage in that the specific resistance is low with high purity copper or when minute amounts of metal are added thereto, these cannot necessarily be considered favorable materials since there is the problem of electromigration and the problem of oxidation resistance during the process.

In particular, since the aspect ratio is becoming even higher in recent years (aspect ratio of 4 or higher), sufficient electromigration resistance and oxidation resistance are being sought.

In light of the above, a proposal has been made for adding Al or Sn (or other various elements such as Ti or Zr) to copper to obtain a copper alloy to be used as the target for a wiring material (for example, c.f. Japanese Patent Laid-Open Publication No. H10-60633). Nevertheless, this is for improving the EM resistance, SM resistance or oxidation resistance without hindering the low resistance characteristics of copper, and could not be used for forming a seed layer in an ultra fine copper wiring process by performing the copper electroplating described above (for example, c.f. Japanese Patent Laid-Open Publication No. H6-177117).

Further, there is also a proposal stating that 0.5 wt % of Sn is effective in reducing the grain boundary diffusion of Cu and improving the EM characteristics (for example, c.f. [Electromigration and diffusion in pure Cu and Cu(Sn) alloy, Mat. Res. Soc. Symp. Proc. Vol. 427, 1996], Materials Research Society, written by C. H. Hu, K. L. Lee, D. GupTa, and P. Blauner (IBM)). Nevertheless, this does not resolve the coagulation problem with the seed layer on the barrier layer formed with the likes of Ta or TaN.

Accordingly, with conventional technology, a copper alloy which allows the formation of a seed layer having a high conductivity and being stable and uniform during copper electroplating has not been obtained and, in particular, a technology for manufacturing a semiconductor element wiring was not necessarily sufficient.

SUMMARY OF THE INVENTION

An object of the present invention is to provide a copper alloy sputtering target which has a favorable conductivity that is necessary during copper electroplating, which allows the formation of a seed layer being stable, uniform and free from the occurrence of coagulation and which exhibits excellent sputtering film formation characteristics, the manufacturing method thereof, and a semiconductor element wiring formed with such a target.

In order to achieve the foregoing object, as a result of intense study, the present inventors discovered a copper alloy sputtering target which will prevent the generation of defects such as voids, hillocks, and disconnections during copper electroplating by adding an appropriate amount of metal elements and which is capable of forming a stable and uniform seed layer having a low specific resistance and favorable electromigration resistance and oxidation resistance, the manufacturing method of this target, and a semiconductor element wiring formed with such a target.

Based on this discovery, the present invention provides a copper alloy sputtering target containing 0.01 to (less than) 0.5 wt % of at least one element selected from Al or Sn, and containing either Mn or Si or both in a total amount of 0.25 wtppm or less. Alternatively, the copper alloy sputtering target contains 0.05 to 0.2 wt % of at least one element selected from Al or Sn, and contains Mn or Si in a total amount of 0.25 wtppm or less. The copper alloy sputtering target can further contain one or more elements selected from among Sb, Zr, Ti, Cr, Ag, Au, Cd, In and As in a total amount of 1.0 wtppm or less, 0.5 wtppm or less, or 0.3 wtppm or less. The inevitable impurities of the copper alloy sputtering target, excluding gas components, can be 10 wtppm or less, or 1 wtppm or less. Preferably, Na and K are respectively 0.05 wtppm or less, U and Th are respectively 1 wtppb or less, oxygen is 5 wtppm or less, nitrogen is 2 wtppm or less, and carbon is 2 wtppm or less. Alternatively, Na and K are respectively 0.02 wtppm or less, U and Th are respectively 0.5 wtppb or less, oxygen is 1 wtppm or less, nitrogen is 1 wtppm or less, and carbon is 1 wtppm or less. The copper alloy sputtering target can have an average crystal grain size of 100 µm or less and an average grain size variation within ±20%.

The present invention also provides semiconductor element wiring formed with the copper alloy sputtering target discussed above. The semiconductor element wiring can be formed as a seed layer on a barrier film of Ta, Ta alloy or the nitrides thereof.

The present invention further provides a method of manufacturing the above referenced copper alloy sputtering target. The method comprises the steps of preparing a mother alloy as the additional element, melting this in a molten metal of copper or low concentration mother alloy to form an ingot, and processing this ingot to form a target. The method further comprises preparing a mother alloy within the solid solubility limit.

DETAILED DESCRIPTION OF THE INVENTION

The copper alloy sputtering target of the present invention contains 0.01 to (less than) 0.5 wt %, preferably 0.05 to 0.2 wt % of at least one element selected from Al or Sn, and contains either Mn or Si or both in a total amount of 0.25 wtppm or less.

As a result, upon performing copper electroplating in particular, the coagulation upon plating is effectively prevented and the wettability with the barrier film is improved. Further, the sheet resistance can be kept low, the oxidization resistance can be improved, and a stable and even seed layer can be formed. Moreover, this is superior in sputter deposition characteristics and useful as the wiring material of a semiconductor element.

If the Al or Sn content is less than 0.05 wt % upon manufacturing the alloy, there will be variations in the composition, and the coagulation prevention effect will deteriorate. And, if this content exceeds 0.5 wt %, the sheet resistance of the sputtered film will increase, and it will be difficult to obtain a target achieving the object of the present invention. Further, there is a problem in that the oxygen content will increase together with the increase of Al or Sn upon the melting procedure in the copper alloy manufacturing process.

The inclusion of Mn and Si will improve the oxidation resistance. Nevertheless, Mn or Si itself has no effect of preventing coagulation, and, since it will increase the sheet resistance when the content exceeds 0.25 wtppm, it is necessary to keep the Mn and Si content 0.25 wtppm or less. In particular, since Mn and Si are easily transferred into ingot from Al and Sn as raw materials for melting, it is important to control contents of Mn and Si in meltingexactly.

The copper alloy sputtering target of the present invention may contain one or more selected from among Sb, Zr, Ti, Cr, Ag, Au, Cd, In and As in a total amount of 0.5 wtppm or less, preferably 0.3 wtppm or less.

These constituent elements will improve the oxidation resistance. Nevertheless, as with Mn and Si, if the content exceeds 0.5 wtppm, the sheet resistance will increase, and, they will significantly deteriorate the coagulation prevention effect of Al and Sn; that is, since they will significantly deteriorate the wettability with the barrier film, it is necessary to keep the content 0.5 wtppm or less when adding such constituent elements. In particular, a preferable additive amount is in a total amount of 0.3 wtppm or less.

With the copper alloy sputtering target of the present invention, the inevitable impurities excluding gas components are 10 wtppm or less, preferably 1 wtppm or less. These impurities will increase the sheet resistance, and deteriorate the coagulation prevention effect of Al and Sn; that is, deteriorate the wettability with the barrier film, and such impurities must be strictly limited.

Further, it is desirable that impurities Na and K are respectively 0.05 wtppm or less, preferably 0.02 wtppm or less; U and Th are respectively 1 wtppb or less, preferably 0.5 wtppb or less; oxygen is 5 wtppm or less, preferably 1 wtppm or less; nitrogen is 2 wtppm or less, preferably 1 wtppm or less; and carbon is 2 wtppm or less, preferably 1 wtppm or less. These impurities; namely, alkali metal elements Na and K, and radioactive elements U and Th will have adverse effects on the semiconductor characteristics even in minute amounts, and it is desirable to keep these elements within the foregoing range.

Further, the gas components of oxygen, nitrogen and carbon contained in the copper alloy sputtering target of the present invention will form intervening substances in the crystal grain boundary and cause the generation of particles. In particular, since these will cause problems of suddenly generating particles during the sputtering target life, it is desirable to reduce these components as much as possible.

Moreover, if copper oxide ($Cu_2O$) is formed on the seed layer due to oxygen, there is a problem in that such portion may dissolve upon electroplating. When the surface of the seed layer is affected by the plating bath as described above, there is a problem in that the electric field will fluctuate at a micro level, and a uniform plated film cannot be formed. Therefore, it is necessary to limit the gas components such as oxygen within the foregoing range.

Further, with the copper alloy sputtering target of the present invention, it is desirable that the average crystal grain size is 100 μm or less, and the variation of the average grain size is within ±20%.

As described above, by controlling the target texture, uniformity of the film (evenness of the film thickness) can be improved throughout the sputtering target life, and the uniformity of the film composition can be improved. In particular, when the wafer size exceeds 300 mm, the film uniformity will become more important.

Moreover, the copper alloy sputtering target of the present invention is useful in the manufacture of semiconductor element wiring, in particular to the formation of a seed layer for semiconductor wiring, and also optimal for the formation of a seed layer on the barrier film of Ta, Ta alloy or nitrides thereof.

The most significant problem in the manufacture of the copper alloy sputtering target of the present invention is that, because the additive amount of additional elements Sn and Al is extremely small, variations arise in the composition at the stage of manufacturing the copper alloy ingot.

In particular, this is because elements such as Sn and Al having a low melting point and low relative density easily evaporate or disperse upon being added to the molten metal of copper. Further, since the relative density is low, there is another problem in that the segregation in the ingot will increase. Moreover, there is a significant amount of impurities mixed from additional elements such as Sn and Al, and there is a problem in that it is difficult to manufacture a high quality copper alloy target.

In light of the above, although the significant amounts of Si and Mn as impurities can be reduced by increasing the melting temperature and sufficiently mixing the molten metal, there is an inconvenience in that the additional elements themselves will also decrease. Even if the additive amount is increased in anticipation of the amount that will decrease, management of the molten metal temperature is difficult, and, since the melting procedure involves numerous changing factors, appropriate adjustment is difficult.

Thus, in the present invention, a single phase mother alloy containing an alloying element in an amount within its solid solubility limit and having a high melting point of about 800° C. is prepared, and this low-alloyed mother alloy is melted with a molten state copper or another molten state low-alloyed mother alloy to form an ingot. Since the melting point is high, impurities such as oxygen can be effectively decreased. As a result of measuring the additional element concentration of this mother alloy, and melting and adding this to the pure copper or low concentration copper mother alloy, a stable, low concentration copper alloy ingot can be manufactured.

Specifically, high purity copper having a purity of 6N or higher and the foregoing copper mother alloy are prepared, and dissolved in a high vacuum atmosphere with the cold crucible dissolution method employing a water-cooled copper crucible to obtain a high purity alloy. The addition of alloying elements by using the copper mother alloy must be made under a sufficiently controlled condition. As the melting method, a high purity graphite crucible may also be used.

Upon melting, in order to reduce the contamination of molten metal caused by its contact with the inner surface of the crucible, it is effective to place a copper plate having a purity of 6N on the inner bottom surface of the crucible.

The alloyed molten metal is promptly cast in a water-cooled copper mold in a high vacuum atmosphere to obtain an ingot. As a result of controlling the texture of this ingot; for instance, by controlling the crystal grain size, sputtering characteristics can be improved.

The surface layer is removed from the manufactured ingot, and the ingot is subject to hot forging, hot rolling, cold rolling and heat treatment so as to form a target material. This target material is further subject to machine processing to form a prescribed shape, and bonded with a backing plate to form a target product.

EXAMPLES AND COMPARATIVE EXAMPLES

The present invention is now explained in detail with reference to the Examples and Comparative Examples. These Examples are merely illustrative, and the present invention shall in no way be limited thereby. In other words, the present invention shall only be limited by the scope of the present invention, and shall include the various modifications other than the Examples of this invention.

Examples 1 to 10

A high purity copper having a purity of 6N or higher and a copper mother alloy containing Al, Sn, Mn, Si or other additive elements were prepared and blended, and melted together in a high vacuum atmosphere with cold crucible melting apparatus employing a water-cooled copper crucible to obtain a high purity copper alloy ingot. The blended high purity copper alloy compositions of Examples 1-10 are shown in Table 1.

Upon melting, in order to reduce the contamination of molten metal caused by its contact with the inner surface of a crucible, a copper plate having a purity of 6N was placed on the inner bottom surface of the crucible. The alloyed molten metal was cast in a water-cooled copper mold in a high vacuum atmosphere to obtain an ingot.

Next, the surface layer of the manufactured ingot was removed to make the ingot ϕ160×60t, and thereafter made to ϕ200 by hot forging at 400° C. Thereafter, this was hot rolled at 400° C. and rolled until ϕ270×20t, and further cold rolled until ϕ360×10t.

Next, after performing heat treatment thereto at 400 to 600° C. for 1 hour, the overall target was rapidly cooled to form a target material. This was subject to machine processing to obtain a target having a diameter of 13 inches and a thickness of 7 mm, and further diffusion bonded with an Al alloy backing plate to obtain a sputtering target assembly.

Measurement of the average grain size was conducted with the method of section based on JIS H0501, wherein 17 points were given concentrically in the planar direction and 3 points on the front face, center and back face in the plate thickness direction to measure the target with a total of 17×3=51 points.

The target obtained pursuant to the above was used to form a sputtered film having a thickness of 100 nm on an 8-inch TaN/Ta/Si substrate. The degree of coagulation of this sputtered film was observed with a high resolution SEM. Moreover, the uniformity of the film sputtered and deposited to a thickness of roughly 500 nm on the Si substrate was measured.

Regarding the foregoing results, in addition to the component and composition of the target, the oxygen content, average grain size, coagulation property, and uniformity of film thickness ($3\sigma(\%)$) are shown in Table 1.

In the present invention, the oxygen content is low, the average crystal grain size is 100 μm or less, and the variation of the average grain size is within ±20%.

And, coagulation is suppressed, and coagulation did not occur at all or the coagulation property was extremely low. Further, it is evident that obtained is a copper alloy sputtering target superior in the film thickness uniformity, and capable of forming a stable and uniform seed layer. As a result, this target can be used to obtain a superior semiconductor element wiring.

a copper alloy target in a case of not using the mother alloy, and changing the grain size and variation thereof, respectively.

These conditions are similarly shown in Table 1. The target obtained pursuant to the above was used to form a sputtered film having a thickness of 100 nm on an 8-inch TaN/Ta/Si substrate.

The degree of coagulation of this sputtered film was observed with a high resolution SEM. Moreover, the uniformity of the film sputtered and deposited to a thickness of roughly 500 nm on the Si substrate was measured.

Regarding the foregoing results of Comparative Examples 1-8, in addition to the component and composition of the target, the oxygen content, average grain size, coagulation property, and uniformity of film thickness ($3\sigma(\%)$) are similarly shown in Table 1.

In Comparative Example 1, Al is 0.008 wt %, the coagulation prevention effect is low, and the coagulation property is strong. In Comparative Example 2, Al exceeds 0.50 wt %,

TABLE 1

| | Al, Sn Concentration (Target Composition) | Si (ppm) | Mn (ppm) | *Sb, etc. (ppm) | Oxygen (ppm) | Average Grain Size (μm) |
|---|---|---|---|---|---|---|
| Example 1 | 0.02 wt % Al | 0.05 | <0.001 | 0.13 | <5 | 96 |
| Example 2 | 0.05 wt % Al | 0.07 | 0.002 | 0.25 | <5 | 70 |
| Example 3 | 0.106 wt % Al | 0.09 | <0.001 | 0.16 | <1 | 85 |
| Example 4 | 0.213 wt % Al | 0.11 | <0.001 | 0.32 | <1 | 46 |
| Example 5 | 0.427 wt % Al | 0.19 | 0.05 | 0.32 | <1 | 61 |
| Example 6 | 0.02 wt % Sn | <0.01 | 0.03 | 0.26 | <5 | 52 |
| Example 7 | 0.05 wt % Sn | 0.05 | 0.17 | 0.29 | <5 | 36 |
| Example 8 | 0.1 wt % Sn | 0.03 | 0.10 | 0.16 | <1 | 61 |
| Example 9 | 0.25 wt % Sn | <0.01 | 0.22 | 0.46 | <1 | 44 |
| Example 10 | 0.5 wt % Sn | <0.01 | 0.21 | 0.32 | <1 | 27 |
| Comparative Example 1 | 0.008 wt % Al | 0.03 | <0.001 | 0.17 | <5 | 63 |
| Comparative Example 2 | 0.86 wt % Al | 0.61 | 0.13 | 0.34 | <5 | 22 |
| Comparative Example 3 | 0.213 wt % Al | 0.36 | 0.05 | 0.53 | <5 | 43 |
| Comparative Example 5 | 0.005 wt % Sn | <0.01 | 0.03 | 0.22 | <5 | 91 |
| Comparative Example 6 | 1.0 wt % Sn | 0.03 | 0.75 | 0.23 | <5 | 43 |
| Comparative Example 7 | 0.25 wt % Sn | 0.05 | 0.45 | 0.71 | <5 | 63 |
| Comparative Example 8 | 0.5 wt % Sn | <0.01 | 0.22 | 0.55 | 10 | 19 |

| | Grain Size Variation (%) | Coagulation Property | Film Thickness Uniformity ($3\sigma$ %) |
|---|---|---|---|
| Example 1 | 19 | Extremely Low Coagulation Property | 17 |
| Example 2 | 13 | Extremely Low Coagulation Property | 15 |
| Example 3 | 16 | No Coagulation Property | 20 |
| Example 4 | 13 | No Coagulation Property | 12 |
| Example 5 | 16 | No Coagulation Property | 18 |
| Example 6 | 17 | Extremely Low Coagulation Property | 15 |
| Example 7 | 18 | Extremely Low Coagulation Property | 13 |
| Example 8 | 18 | Extremely Low Coagulation Property | 11 |
| Example 9 | 19 | No Coagulation Property | 16 |
| Example 10 | 13 | No Coagulation Property | 13 |
| Comparative Example 1 | 15 | Strong Coagulation Property | 13 |
| Comparative Example 2 | 9 | Coagulation Property Existed | 9 |
| Comparative Example 3 | 11 | Coagulation Property Existed | 14 |
| Comparative Example 5 | 17 | Strong Coagulation Property | 21 |
| Comparative Example 6 | 15 | Coagulation Property Existed | 18 |
| Comparative Example 7 | 18 | Strong Coagulation Property | 13 |
| Comparative Example 8 | 29 | Low Coagulation Property | 25 |

*Total of Sb, Zr, Ti, Cr, Ag, Au, Cd, In, As

Comparative Examples 1 to 8

Under the same manufacturing conditions as with the Examples, materials of similar alloy components but outside the scope of the present invention were used to manufacture Si also increased, the recrystallization temperature is high, and the coagulation prevention effect is low. Further, as shown in Comparative Example 3, when Si increases (exceeds 0.25 ppm), the coagulation prevention effect will deteriorate.

In Comparative Example 4, although the coagulation property is low, the oxygen content is high, and the variation of the grain size is significant, and the uniformity of the film thickness is inferior.

In Comparative Example 5, since the Sn content is less than 0.02 wt %, the coagulation prevention effect is low, and the coagulation property was strong. Contrarily, in Comparative Example 6, the Sn content exceeded 0.5 wt %, and the Mn content simultaneously increased, the recrystallization temperature was high, and the coagulation property was strong. As shown in Comparative Example 7, when the Mn content is high, the coagulation prevention effect will deteriorate.

Further, in Comparative Example 8, although the coagulation property is low, the variation of the grain size is significant, and the uniformity of the film thickness is inferior.

Examples 11-1 to 11-5

Next, in order to manufacture the mother alloy and check the deviation from the target composition, a mother alloy was prepared in a high vacuum atmosphere with the cold crucible dissolution method. The aluminum content of this mother alloy (copper) was made to be within the solid solubility limit at 4.632 wt %. The liquidus temperature of this mother alloy was approximately 1060° C.

Next, 6N grade high purity copper was melted at 1400° C. in a high vacuum atmosphere with the cold crucible dissolution method, 0.106 wt % of the mother alloy was added thereto, this was cast when the molten metal temperature reached approximately 1150 to 1400° C., and cast ingot was prepared thereby. In addition, a total of 5 ingots were prepared with the same method.

And, the aluminum content of these ingots was analyzed with the ICP emission spectrometry. The results are shown in Table 2.

TABLE 2

| | Target Composition | Mother Alloy Composition (Al Concentration) | Deviation from Target Composition |
|---|---|---|---|
| Example 11-1 | 0.106 wt % | 4.632 wt % | 1.33% |
| Example 11-2 | 0.106 wt % | 4.632 wt % | −4.36% |
| Example 11-3 | 0.106 wt % | 4.632 wt % | −3.97% |
| Example 11-4 | 0.106 wt % | 4.632 wt % | −0.26% |
| Example 11-5 | 0.106 wt % | 4.632 wt % | 1.98% |
| Comparative Example 9-1 | 0.106 wt % | — | −9.30% |
| Comparative Example 9-2 | 0.106 wt % | — | −6.36% |
| Comparative Example 9-3 | 0.106 wt % | — | 2.33% |
| Comparative Example 9-4 | 0.106 wt % | — | −11.23% |
| Comparative Example 10-1 | 0.106 wt % | 31.33 wt % | 6.39% |
| Comparative Example 10-2 | 0.106 wt % | 31.33 wt % | −4.63% |
| Comparative Example 10-3 | 0.106 wt % | 31.33 wt % | −7.39% |
| Comparative Example 10-4 | 0.106 wt % | 31.33 wt % | −15.45% |

Comparative Examples 9-1 to 9-4

6N grade high purity copper was melted at 1400° C. in a high vacuum atmosphere with the cold crucible dissolution method, 0.106 wt % of aluminum was added thereto, this was cast when the molten metal temperature reached approximately 1150 to 1400° C., and cast ingot was prepared thereby. In addition, a total of 4 ingots were prepared with the same method.

And, the aluminum content of these ingots was analyzed with the ICP emission spectrometry. The results are similarly shown in Table 2.

Comparative Examples 10-1 to 10-4

A mother alloy was prepared in a high vacuum atmosphere with the cold crucible dissolution method. The aluminum content of this mother alloy (copper) was made to exceed the solid solubility limit at 31.33 wt %. The liquidus temperature of this mother alloy was approximately 800° C.

Next, 6N grade high purity copper was melted at 1400° C. in a high vacuum atmosphere with the cold crucible dissolution method, 0.106 wt % of the mother alloy was added thereto, this was cast when the molten metal temperature reached approximately 1150 to 1400° C., and cast ingot was prepared thereby. In addition, a total of 4 ingots were prepared with the same method.

And, the aluminum content of these ingots was analyzed with the ICP emission spectrometry. The results are similarly shown in Table 2.

As evident from Table 2, in the cases of Examples 11-1 to 11-5, the deviation (variation) from the target composition in each case was small, and within 5%. Meanwhile, in Comparative Examples 9-1 to 9-4 which directly added an alloy element without using the mother alloy, and in Comparative Examples 10-1 to 10-4 that used a mother alloy exceeding the solid solubility limit, the deviation (variation) from the target composition was significant, and exceeded 5% by far. When an appropriate mother alloy is not used as in the foregoing cases, the stability of manufacture was extremely inferior.

In particular, as the mother alloy, a melting point (liquidus temperature) of 800° C. or higher, preferably around 1000° C. is required, and it has become evident that a single phase alloy (within the composition range within the solid solubility limit of aluminum or tin) is suitable therefor.

The present invention yields a superior effect in that it is able to obtain a copper alloy sputtering target which allows the formation of a seed layer having a low sheet resistance and being stable, uniform and free from the occurrence of coagulation during copper electroplating and which exhibits excellent sputtering film formation characteristics, the manufacturing method thereof, and a semiconductor element wiring formed with such a target.

I claim:

1. A copper alloy sputtering target for forming a thin film seed layer for semiconductor wiring, the sputtering target consisting of 0.01 to less than 0.5 wt % of Al, Si or both of Si and Mn in a total amount of 0.03 wtppm to 0.25 wtppm, at least one additive element selected from the group consisting of Sb, Zr, Ti, Cr, Ag, Au, Cd, In and As in a total amount of 1.0 wtppm or less, and the remainder being Cu and inevitable impurities, said inevitable impurities having a total content of 1 wtppm or less and consisting of elements excluding Cu, Al, Mn, Si, said at least one additive element, and gas component elements, and said copper alloy sputtering target having an average crystal grain size of 100μm or less and a variation of the average crystal grain size of within ±20%.

2. The copper alloy sputtering target according to claim 1, wherein said copper alloy sputtering target has 0.05 to 0.2 wt % of Al.

3. The copper alloy sputtering target according to claim 2, wherein said total amount of said at least one additive element selected from the group consisting of Sb, Zr, Ti, Cr, Ag, Au, Cd, In and As is 0.3 wtppm or less.

4. The copper alloy sputtering target according to claim 1, wherein said total amount of said at least one additive element selected from the group consisting of Sb, Zr, Ti, Cr, Ag, Au, Cd, In and As is 0.13 wtppm to 1.0 wtppm.

5. The copper alloy sputtering target according to claim 4, wherein said total amount of said at least one additive element selected from the group consisting of Sb, Zr, Ti, Cr, Ag, Au, Cd, In and As does not exceed 0.5 wtppm.

6. The copper alloy sputtering target according to claim 5, wherein said total amount of said at least one additive element selected from the group consisting of Sb, Zr, Ti, Cr, Ag, Au, Cd, In and As does not exceed 0.3 wtppm.

7. The copper alloy sputtering target according to claim 1, wherein the content of Si in the sputtering target is 0.03 to 0.19 wtppm and the content of Mn in the sputtering target is 0.002 to 0.22 wtppm.

8. The copper alloy sputtering target according to claim 1, wherein said copper alloy sputtering target has 0.05 wtppm or less of Na and K, respectively and 1 wtppb or less of U and Th, respectively as inevitable impurities.

9. The copper alloy sputtering target according to claim 1, wherein said copper alloy sputtering target has 0.02 wtppm or less of Na and K, respectively and 0.5 wtppb or less of U and Th, respectively as inevitable impurities.

10. A copper alloy sputtering target for forming a thin film seed layer for semiconductor wiring, the sputtering target consisting of 0.01to less than 0.5 wt % of Al, Si or both of Si and Mn in a total amount of 0.03 wtppm to 0.25 wtppm, at least one additive element selected from the group consisting of Sb, Zr, Ti, Cr, Ag, Au, Cd, In and As in a total amount of 1.0 wtppm or less, and the remainder being Cu and inevitable impurities said inevitable impurities, excluding gas component elements, having a total content of 1 wtppm or less and consisting of elements other than Cu, Al, Mn, Si, said at least one additive element and gas component elements, said gas component elements including 5 wtppm or less of oxygen, 2 wtppm or less of nitrogen, and 2 wtppm or less of carbon, and said copper alloy sputtering target having an average crystal grain size of 100 µm or less and a variation of the average crystal grain size of within ±20%.

11. The copper alloy sputtering target according to claim 10, wherein said copper alloy sputtering target has 0.05 to 0.2 wt % of Al.

12. The copper alloy sputtering target according to claim 10, wherein said total amount of said at least one additive element selected from the group consisting of Sb, Zr, Ti, Cr, Ag, Au, Cd, In and As is 0.3 wtppm or less.

13. The copper alloy sputtering target according to claim 10, wherein the content of Si in the sputtering target is 0.03 to 0.19 wtppm and the content of Mn in the sputtering target is 0.002 to 0.22 wtppm.

14. The copper alloy sputtering target according to claim 10, wherein said total amount of said at least one additive element selected from the group consisting of Sb, Zr, Ti, Cr, Ag, Au, Cd, In and As is 0.13 wtppm to 1.0 wtppm.

15. The copper alloy sputtering target according to claim 10, wherein said copper alloy sputtering target has 0.05 wtppm or less of each of Na and K and 1 wtppb or less of each of U and Th as inevitable impurities.

16. The copper alloy sputtering target according to claim 10, wherein said copper alloy sputtering target has 0.02 wtppm or less of each of Na and K and 0.5 wtppb or less of each of U and Th as inevitable impurities.

17. The copper alloy sputtering target according to claim 10, wherein said average crystal grain size is 61 to 96 µm.

18. The copper alloy sputtering target according to claim 1, wherein said average crystal grain size is 61 to 96 µm.

19. A copper alloy sputtering target for forming a thin film seed layer for semiconductor wiring, the sputtering target consisting of 0.01 to less than 0.5 wt % of Al, both Mn and Si in a total amount of 0.03 wtppm to 0.25 wtppm, at least one additive element selected from the group consisting of Sb, Zr, Ti, Cr, Ag, Au, Cd, In and As in a total amount of 1.0 wtppm or less, and the remainder being Cu, and said copper alloy sputtering target having an average crystal grain size of 100 µm or less and a variation of the average crystal grain size of within ±20%.

20. The copper alloy sputtering target according to claim 19, wherein the content of Si in the sputtering target is 0.03 to 0.19 wtppm and the content of Mn in the sputtering target is 0.002 to 0.22 wtppm.

* * * * *